(12) United States Patent
Nakamori et al.

(10) Patent No.: US 6,589,338 B1
(45) Date of Patent: Jul. 8, 2003

(54) DEVICE FOR PROCESSING SUBSTRATE (75) Inventors: Mitsunori Nakamori, Tosu (JP); Hiroki Taniyama, Tosu (JP); Takanori Miyazaki, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 16 days.

(21) Appl. No.: 09/725,951

(22) Filed: Nov. 30, 2000

(30) Foreign Application Priority Data

Dec. 2, 1999 (JP) .......................................... 11-343780

(51) Int. Cl.[7] .............................................. C23C 14/58
(52) U.S. Cl. ........................... 118/50; 118/603; 118/56; 118/52; 118/602
(58) Field of Search ............................ 118/52, 56, 320, 118/50, 500, 501, 600, 602, 603, 326, 70; 427/240, 425; 396/611; 134/902, 33, 109, 153, 157, 182, 183

(56) References Cited

U.S. PATENT DOCUMENTS 5,871,584 A * 2/1999 Tateyama et al. ............ 118/52
5,997,653 A * 12/1999 Yamasaka .................... 134/153
6,159,288 A * 12/2000 Satou et al. .................. 118/70
6,247,479 B1 * 6/2001 Taniyama et al. ........... 134/902

* cited by examiner

Primary Examiner—Richard Crispino
Assistant Examiner—George R. Koch, III
(74) Attorney, Agent, or Firm—Smith, Gambrell & Russell, LLP (57) ABSTRACT

This substrate processing device is identical to a wafer cleaning device 5 for cleaning a wafer W, which includes a supply nozzle 34 for supplying APM and the pure water, a spin chuck 31 for carrying the wafer W and a container 31 for accommodating the spin chuck 31. The container 30 includes an inner processing chamber 42 and an outer processing chamber 43 and is constructed so as to be movable up and down to the spin chuck 31. A first drainage line 50 is connected to the inner processing chamber 42 to discharge APM and the interior atmosphere, while a second drainage line 51 is connected to the outer processing chamber 43 to discharge pure water and the interior atmosphere. With the connection of the first drainage line 50, the wafer cleaning device 5 is adapted so that the supply nozzle 34 supplies APM to a surface of the wafer W again. Therefore, it is possible to reuse this processing liquid advantageously and additionally, an exhaust displacement can be reduced.

17 Claims, 9 Drawing Sheets

DEVICE FOR PROCESSING SUBSTRATE

BACKGROUND OF THE INVENTION

1. Technical Field of the Invention

The present invention relates to a substrate processing device for processing substrates, for example, semiconductor wafers, LCD glass substrates, etc.

2. Description of the Related Art

Generally, in the manufacturing process of semiconductor devices, there is used a cleaning device for removing contaminations, for example, particles, organic contaminations, metallic impurities, etc. adhering to front and back surfaces of e.g. a semiconductor wafer (which will be called "wafers etc." hereinafter). As one cleaning device for cleaning wafers, there is known, for example, a "spin" type wafer cleaning device.

Figure 10:
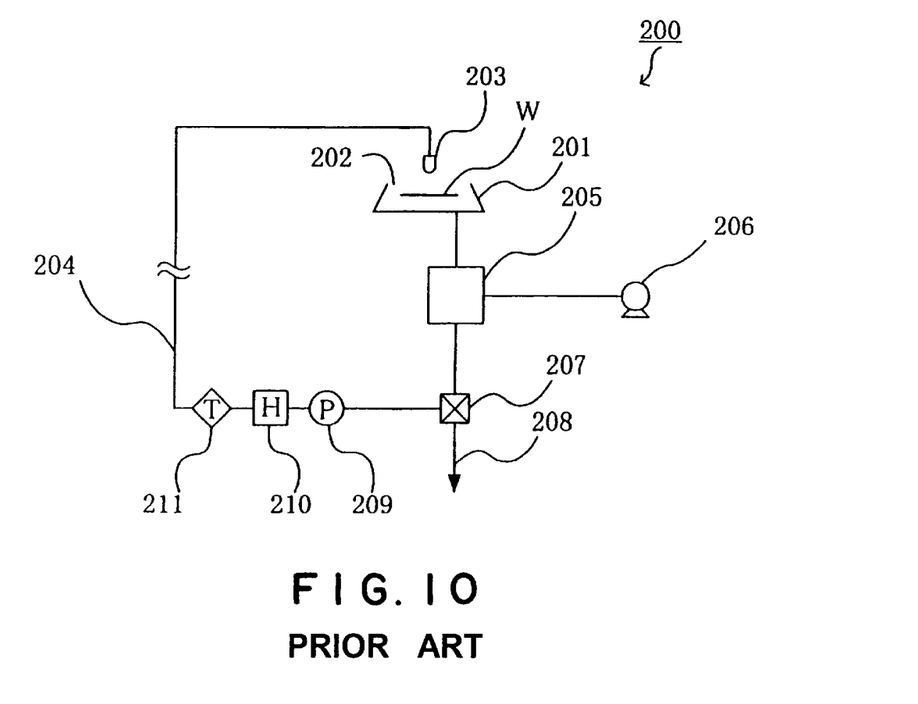
FIG. 10 is a line diagram of the wafer cleaning device in general.

FIG. 10 is a line diagram of a conventional wafer cleaning device 200. As shown in FIG. 10, in the conventional wafer cleaning device 200, a chemical cleaning (chemical processing) and the subsequent rinsing (rinse processing) have been performed to successively supply chemical liquids and pure water to a wafer W accommodated in a processing chamber 202 of a container 201, by a supply nozzle 203. Note that the chemical liquid can give full play to its higher cleaning ability when being adjusted at a designated temperature rather than a normal temperature. For instance, there exist a chemical liquid called "APM" having ammonia as its main ingredient, temperature-controlled at the order from 40 to 90° C. in temperature; a chemical liquid called "HPM" having hydrochloric acid as its main ingredient, temperature-controlled at the order from 50 to 90° C.; a chemical liquid called "SPM" having sulfuric acid as its main ingredient, temperature-controlled at the order from 100 to 150° C. and others.

Hereat, the wafer cleaning device 200 is constructed so as to reuse the chemical liquid drained from the processing chamber 202 in view of saving the consumption of the chemical liquid. That is, a recycle line 204 is connected with the bottom of the processing chamber 202 and the chemical liquid is discharged into the recycle line 204. Additionally, the pure water and an interior atmosphere in the processing chamber 202 are respectively discharged into the recycle line 204. Again, the recycle line 204 is further provided with a gas-liquid separating mechanism 205. The gas-liquid separating mechanism 205 is connected with an exhausting fan 206. The cleaning liquid flows into the recycle line 204 via the gas-liquid separating mechanism 205, while the interior atmosphere of the processing chamber 202 flows to the exhausting fan 206. A three-directional valve 207 is arranged in the recycle line 204 and also connected with a pure water drain line 208. With the switching operation of the three-directional valve 207, the chemical liquid flows in the recycle line 204 during the chemical cleaning process. While, during the rinsing process, the pure water flows in the pure water drain line 208 in order to drain the water.

In the recycle line 204, there are further arranged a pump 209, a heater 210 and a filter 211 in series. An exit of the recycle line 204 is connected with the supply nozzle 203. In this way, by the operation of the pump 209, the chemical liquid flowing through the gas-liquid separating mechanism 205 and also the three-directional valve 207 is successively fed to the heater 210 for regulating the temperature of the chemical liquid and the subsequent filter 211 for cleaning the chemical liquid. Thereafter, the chemical liquid is again returned to the supply nozzle 203 in order to reuse the liquid for the chemical cleaning. The device 200 further includes a pure water supply line (not shown) connected with the supply nozzle 203 to supply the pure water. After completing the chemical cleaning, the pure water is ejected from the supply nozzle 203 in the rinsing process.

However, the conventional wafer cleaning device 200 has a problem that the droplets of pure water used in the rising process may stay in the recycle line 204 since the draining of the chemical liquid and the pure water is carried out through the recycle line 204. In case of performing the chemical cleaning process and the rinsing process against plural wafers W in the processing chamber 202 continuously, the droplets of pure water remained in the recycle line 204 in the previous rinsing process will mix with the chemical liquid in the next-coming chemical cleaning process. Since the chemical liquid is reused over and over again, it is mixed with the pure water whenever the chemical liquid is reused, so that the concentration is decreased. The chemical liquid diluted with the water would exhibit its deteriorated cleaning ability, causing the possibility of insufficient cleaning effect.

Further, as the pure water used for the rinsing process generally has a normal temperature, the recycle line 204 will be cooled when the pure water is discharged. Thus, since the chemical liquid is drained into the recycle line 204 cooled down in the previous rinsing process, the temperature of the chemical liquid is lowered remarkably. Even if required to regulate the temperature of the so-cooled chemical liquid, it cannot be overtaken by the ability of the heater 210, so that the chemical liquid that does not reach the designated temperature will be reused in the chemical cleaning process. The chemical liquid of lowered temperature also has a possibility of exhibiting the insufficient cleaning effect because of its deteriorated cleaning ability.

Alternatively, in the conventional wafer cleaning device 200, the interior atmosphere has been discharged with a great displacement. Therefore, the exhausting fan 206 has been subjected to an excessive burden with a steep rise in running cost.

SUMMARY OF THE INVENTION

Accordingly, it is therefore an object of the present invention to provide a substrate processing device which allows the processing liquid to be reused advantageously and which can reduce an exhaust displacement of the device.

The first feature of the invention resides in a substrate processing device for processing a substrate, comprising: a holder for carrying the substrate; a nozzle for supplying plural kind of processing liquid to a surface of the substrate; a container arranged around the holder, the container having a plurality of processing chambers, the plurality of processing chambers having a plurality of openings respectively which are arranged in succession, wherein the container is movable to the holder relatively in such a way that each opening of the processing chamber can be moved and positioned around the circumference of the substrate held by the holder, a bottom of each processing chamber is connected with a line for discharging processing liquid from the processing chamber, and at least one of the lines is connected to the nozzle so that the discharged processing liquid is supplied to a surface of the substrate through the line as recycling circuit.

Therefore, in case of using e.g. the plural processing liquids, it is executed to move the openings of the different containers to the circumference of the substrate carried by the holding means, corresponding to the kinds of the processing liquids on use. After processing the substrate, the processing liquids are drained through the drainage lines, respectively. At least one processing liquid of the so-drained liquids is again supplied to the surface of the substrate through the recycle line. According to the invention, even if the respective processing liquids are remained in the drainage lines respectively, the containers are altered corresponding to the kinds of the processing liquids and therefore, there is no possibility that the processing liquids of different kinds are present in the same line. Especially, as for the processing liquid to be reused, there is no possibility of dilution that the reused processing liquid is mixed with the different processing liquid. Therefore, the processing liquid can be reused with its high processing ability.

Moreover, since the drainage lines are respectively fixed corresponding to the processing liquids despite that the different processing liquids have the different optimum temperatures to enhance the processing ability, it is possible to present one drainage line from being cooled by the drainage of the different processing liquid. Especially, as for the processing liquid to be reused, it is not subjected to temperature change, for example, temperature's falling due to the cooling of the drainage line, whereby the processing liquid can be reused with its high processing ability continuously.

Further, the containers are moved relatively to each other corresponding to the kinds of processing liquids and the interior atmospheres of the containers are discharged respectively. Accordingly, it is possible to change the exhaust displacement of the device so as to correspond to the respective processes.

The second feature of the invention resides in that the opening of the processing chamber is moved to a position around the circumference of the substrate held by the holder so that the processing chamber according to processing liquid supplied to the substrate is disposed to a position around the substrate.

The third feature of the invention resides in that the plurality of processing chamber includes at least a first processing chamber and a second processing chamber, the container including a first member defining the first processing chamber and a part of the second processing chamber and a second member defining the second processing chamber in cooperation with the first member, the first processing chamber being provided with a first opening, the second processing chamber being provided with a second opening, the container is movable with respect to the holder so that the first opening and the second opening can be moved to the substrate held by the holder.

The fourth feature of the invention resides in that the holder is rotatable while mounting the substrate thereon.

The fifth feature of the invention resides in that the substrate is horizontally mounted on the holder and can rotate about a vertical axis; the first member being positioned under the second member; the first opening being positioned under the second opening.

The sixth feature of the invention resides in further comprising a main storage tank interposed in the recycle line to store the processing liquid. The seventh feature of the invention resides in further comprising a circulatory line for circulating the processing liquid in the main storage tank, wherein the circulatory line is provided with a temperature controller which adjusts temperature of the processing liquid.

With the arrangement mentioned above, the main storage tank is connected to at least one line of the respective lines thereby to store at least one processing liquid of the drained processing liquids in the main storage tank. The processing liquid stored in the main storage tank is supplied to the supply means through the supply line, completing the recycling of the processing liquid. Further, while storing the liquid in the main storage tank, the liquid is circulated through the circulatory line.

The eighth feature of the invention resides in that the recycle line is provided with a temperature controller which adjusts temperature of the processing liquid. The ninth feature of the invention resides in further comprising a sub-storage tank arranged on an upstream side of the recycle line, wherein the temperature controller is disposed in a connecting line which connects the sub-storage tank with the main storage tank.

With the structure mentioned above, the processing liquid for recycling is temporarily stored in the sub-storage tank and thereafter, the liquid is supplied to the main storage tank through the connecting line. Before and after supplying the processing liquid to the main storage tank, the temperature of the processing liquid is twice adjusted by the connecting lines and the circulatory line, respectively. Thus, owing to the provision of two opportunities to control the temperature of the processing liquid, it can be adjusted to the designated temperature stably and certainly.

The tenth feature of the invention resides in further comprising a sub-storage tank arranged on an upstream side of the recycle line, wherein the temperature controller is provided in the sub-storage tank. Since the temperature controller controls the temperature of the processing liquid while it is stored in the sub-storage tank, the processing liquid can be adjusted in temperature with room.

The eleventh feature of the invention resides in further comprising a three-directional valve arranged between the main storage tank and the nozzle and a return line for returning the processing liquid from the three-directional valve to the main storage tank.

The twelfth feature of the invention resides in that the main storage tank is connected to supplementary tank for supplementing the processing liquid into the main tank.

The thirteenth feature of the invention resides in that the first member and the second member are movable up and down relatively each other.

The fourteenth feature of the invention resides in that the first member and the second member descend, the first opening being closed, the second opening being positioned under a level of the holder, then the substrate being transferred to and from the holder.

The fifteenth feature of the invention resides in that respective atmospheres in the first and second containers are also discharged through the drainage lines connected to the bottom surfaces of the first and second containers.

The sixteenth feature of the invention resides in further comprising respective gas-liquid separating units are arranged in the drainage lines, respectively.

The seventeenth feature of the invention resides in that the first member and the second member descend, the second opening being positioned beside the substrate held by the holder while the first opening is closed, the atmosphere in the second processing chamber being discharged through the line connected to the bottom surfaces of the second processing chamber The eighteenth feature of the invention resides in that when chemical liquid is selected among a plurality of liquids for processing, the first opening is positioned beside the substrate held by the holder, the second opening being positioned above the first opening, the atmosphere of the chemical liquid is discharged through the first and second processing chambers and through the both lines respectively connected to the surfaces of the first and second processing chamber.

The nineteenth feature of the invention resides in further comprising exhaust lines respectively connected to the bottom surfaces of the first processing chamber and the second processing chamber in order to discharge respective atmospheres in the first and second processing chamber. With the structure mentioned above, the discharging of the processing liquid, the drainage and the interior atmosphere is carried out in different lines, respectively. Particularly in the processing liquid for recycling, the processing liquid is not influenced by exhaust gas because the processing liquid and the interior atmosphere are not present in the identical line.

DESCRIPTION OF THE PREFERRED EMBODIMENT

Preferred embodiments of the present invention will be described with reference to FIGS. 1 to 9. Hereat, we explain the embodiments on ground of a cleaning apparatus into which wafers in the form of carriers are loaded to wash and dry the wafers and from which the so-cleaned wafers are unloaded in the form of carriers.

Figure 1:
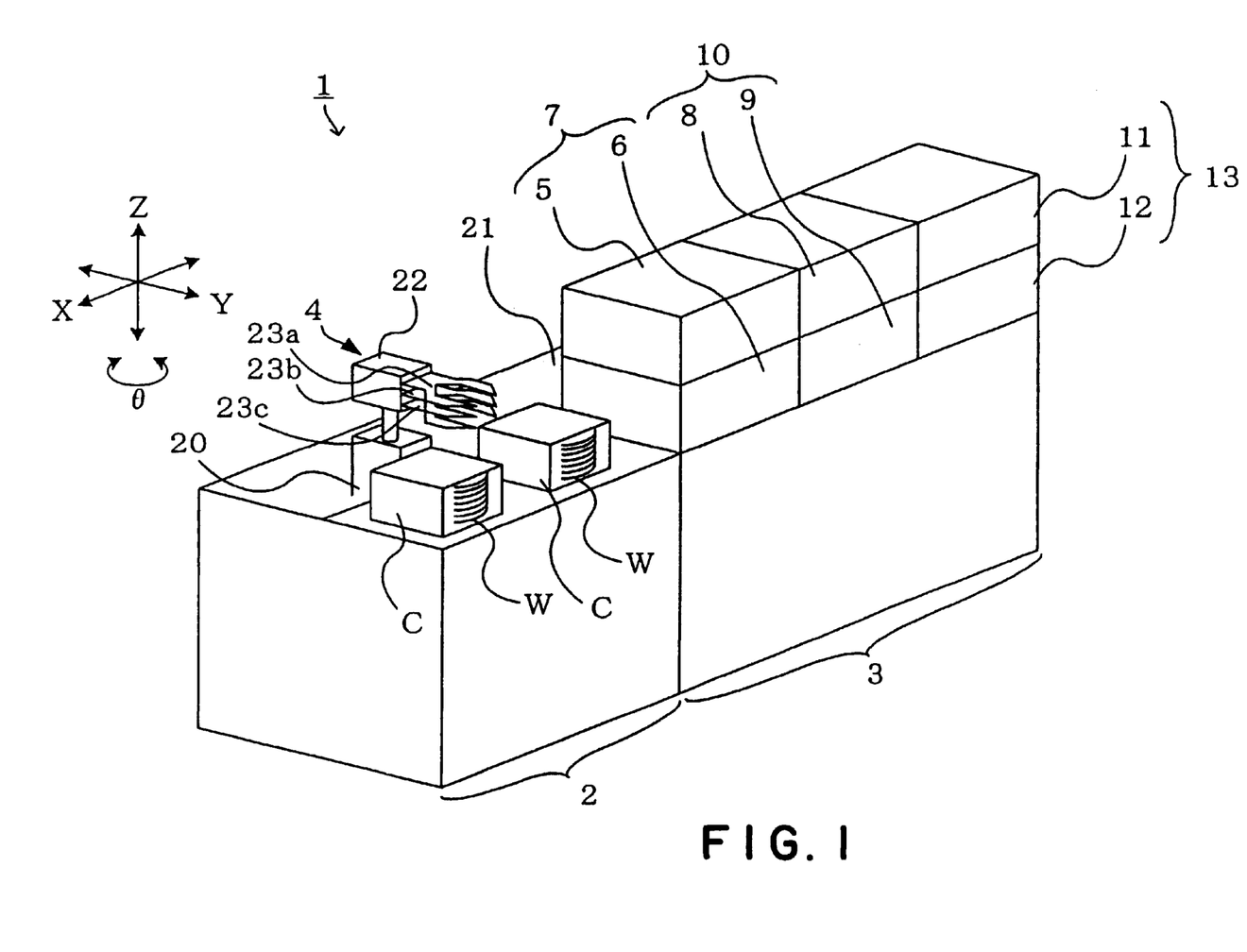
FIG. 1 is a perspective of a cleaning apparatus equipped with a wafer cleaning device in accordance with the first embodiment of the present invention.

FIG. 1 is a perspective view of a cleaning apparatus 1 for explanation of the embodiments of the present invention. This cleaning apparatus 1 includes a mounting section 2 for mounting carriers C accommodating wafers W therein, a cleaning section 3 for carrying out a designated cleaning process for the wafers W and a transfer arm 4 for delivering the wafers W between the mounting section 2 and the cleaning section 3.

The mounting section 2 is provided with a structure capable of mounting plural carriers, for example, two carriers C each accommodating twenty-five sheets of wafers W In the cleaning section 3 adjacent to the mounting section 2, there are provided a wafer-cleaning-device group 7 having two wafer cleaning devices 5, 6 stacked up and down, a wafer-cleaning-device group 10 having two wafer cleaning devices 8, 9 stacked up and down and a wafer-cleaning-device group 13 having two wafer cleaning devices 11, 12 stacked up and down.

In the wafer cleaning devices 5 and 6, a SC1 cleaning (ammonia processing) using a chemical liquid called APM (a mixture of $NH_4OH/H_2O_2/H_2O$) having ammonia as its main ingredient is carried out to remove impurities, such as organic contaminations and particles, adhering to the wafers' surfaces. Further, the wafer cleaning devices 5, 6 are constructed so as to perform a rinsing (rinse processing) using a processing liquid, for example, pure water (DIW) and also the subsequent drying. In the wafer cleaning devices 8 and 9, a SC2 cleaning (hydrochloric acid processing) using a cleaning liquid called HPM (a mixture of $HCl/H_2O_2/H_2O$) having hydrochloric acid as its main ingredient is carried out to remove metallic ions. Further, the wafer cleaning devices 8, 9 are constructed so as to perform the rinsing (rinse processing) using the pure water and also the subsequent drying. In the wafer cleaning devices 11 and 12, a HF cleaning (fluoride acid processing) using a cleaning liquid called DHF (a mixture of $HF/H_2O$) having fluoride acid as its main ingredient is carried out to remove oxidation films etc. formed on the wafers' surfaces. Further, the wafer cleaning devices 11, 12 are constructed so as to perform the rinsing (rinse processing) using the pure water and also the subsequent drying. In the cleaning section 3, the designated cleaning process is carried out by loading the wafers W into the wafer-cleaning-device groups 7, 10, and 13 in sequence. For example, if the wafers W are subjected to the SC1 cleaning, the rinsing and the drying by the wafer cleaning device 5 on the upper stage, thereafter the same wafers W are successively transported into the wafer cleaning devices 8, 11 on the same stage. Thus, the cleaning section 3 is adapted so as to proceed the designated cleaning process by the wafer cleaning devices 5, 8, 11 of the upper stage and the wafer cleaning devices 6, 9, 12 of the lower stage simultaneously.

Note that the above-mentioned arrangement and combination of the wafer-cleaning-device groups and the wafer cleaning devices may be modified in accordance with the kind of cleaning required for the wafers W, optionally. For instance, a certain wafer-cleaning-device group may be eliminated. Alternatively, conversely, an additional wafer-cleaning-device group may be incorporated into the section. Further, it is also possible to increase or reduce the number of wafer cleaning devices in the wafer-cleaning-device group.

The transfer arm 4 is equipped with a base 20 which is movable on a conveyer line 21 formed along the line of the mounting section 2 and the cleaning section 3, in a direction (X) parallel with a direction of the line of the wafer-cleaning-device groups 7, 10, 13. An arm unit 22 is attached to the base 20. This arm unit 22 can move in a perpendicular direction (Y) to the X-direction in a horizontal plane and also move a vertical direction (Z) to the X-direction. Further, the arm unit 22 can rotate in a circumferential direction (θ) about the Z-direction as a rotational center. In the transfer arm 4, the wafers W before the designated cleaning process are picked one by one from the carrier C mounted on the mounting section 2, by an intermediate arm 23b and a lower arm 23c. While, by an upper arm 23a, the wafers W after the designated cleaning process in the cleaning section 3 are accommodated one by one into the carrier C. In this way, the cleaning apparatus 1 is adapted so as to take the wafers W in and out of the respective wafer cleaning devices 5, 6, 8, 9, 11, 12 by means of the common transfer arm 4.

Figure 2:
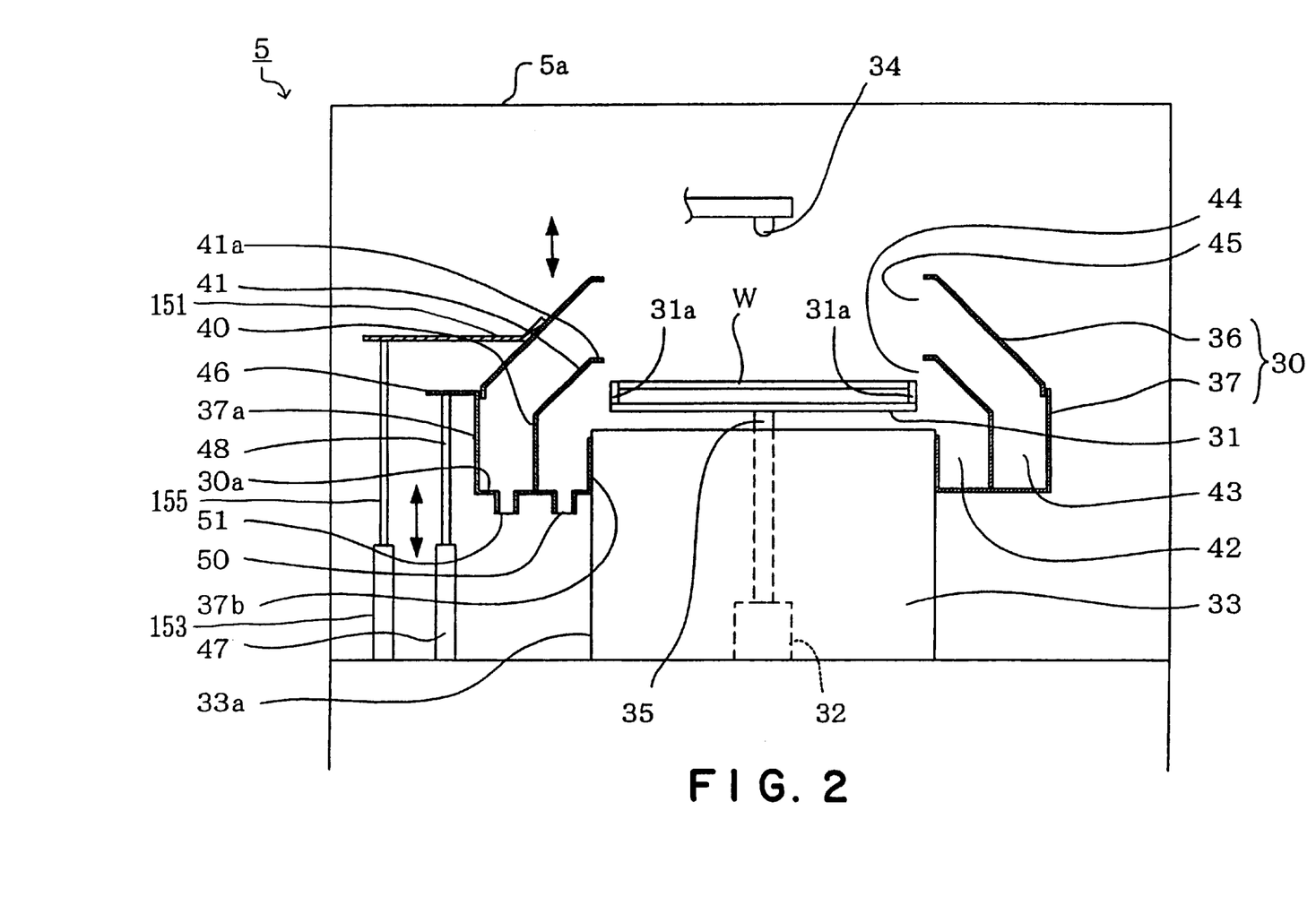
FIG. 2 is a sectional view of the wafer cleaning device of the first embodiment.

Since the wafer cleaning devices 5, 6, 8, 9, 11, 12 are similar in structure, we now describe the wafer cleaning device 5 representatively. As shown in FIG. 2, there are provided, in a casing 5a of the wafer cleaning device 5, an annular container 30 at the center of the casing 5a, carrying means, in other word, holder, for example, a spin chuck 31 accommodated in the container 30 to carry the wafer W rotatably, a pedestal 33 which protects a motor 32 for rotating the spin chuck 31 from an interior atmosphere of the container 30 and also projects into the container 30 through an opening (not shown) formed in a bottom face 30a of the container 30, and a supply nozzle 34 for supplying APM and the pure water to the surface of the wafer W carried by the spin chuck 31. Note, the motor 32 has a rotating shaft 35 connected to the lower face of the spin chuck 31. This rotating shaft 35 penetrates through the top face of the pedestal 33. Provided on the casing's wall is a closing door (not shown) which moves up and down thereby to open and close in case of taking the wafer W in and out of the wafer cleaning device 5. Note that the spin chuck 31 has a structure capable of carrying the wafer W in its horizontal posture through a holding part 31a consisting of a centrifugal chuck or the like.

The container 30 surrounds the circumference of the wafer W and also prevents APM, the pure water, etc. supplied to the surface of the wafer W from being dispersed to the periphery of the wafer W. The container 30 includes, for example, an upper cup 36 (top plate) as a second member and a lower cup 37 (container body) as a first member. The lower cup 37 has an annular wall 40 standing on the bottom face 30a and a rectifying wall 41 attached to the top of the annular wall 40. The rectifying wall 41 is inclined gradually inward as it rises upward, provided with a horizontal upper end 41a. Owing to the provision of the annular wall 40 and the rectifying wall 41, the interior of the container 30 is divided into several (two) chambers, that is, an inner processing chamber 42 and an outer processing chamber 43.

In this way, there are defined, in multistage, an opening 44 of the inner processing chamber 42 moving in the vicinity of the wafer W and an opening 45 of the outer processing chamber 43 moving in the vicinity of the wafer W. The upper cup 36 also functions as a top plate forming an upper margin of the uppermost opening 45. The upper cup 36 is provided, on its outer face, with a bracket 151 to which a piston rod 155 of a cylinder 153 is connected. Therefore, with the operation of cylinder 153, it is possible to move the upper cup 36 up and down. On the other hand, another bracket 46 is attached to an outer peripheral face 37a of the lower cup 37 and also connected to a piston rod 48 of a cylinder 47. Thus, the lower cup 37 can move up and down owing to the operation of the cylinder 47. When the lower cup 37 moves up and down, an inner peripheral face 37b of the lower cup 37 slides on the outer peripheral face 33a of the pedestal 33.

The wafer cleaning device 5 is constructed so as to perform the SC1 cleaning in the inner processing chamber 42 and the rinsing in the outer processing chamber 43. In both cases of the SC1 cleaning and the rinsing, there is commonly employed a rotational cleaning method that the spin chuck 31 is rotated to disperse the cleaning liquid over the whole surface of the wafer W due to the centrifugal force, accomplishing the uniform cleaning. A first drainage line 50 is connected with the bottom face 30a of the inner processing chamber 42 to perform both draining of APM and exhausting of the interior atmosphere. Similarly, a second drainage line 51 is connected with the bottom face 30a forming the outer processing chamber 43 to perform both draining of the pure water and exhausting of the interior atmosphere.

Figure 3:
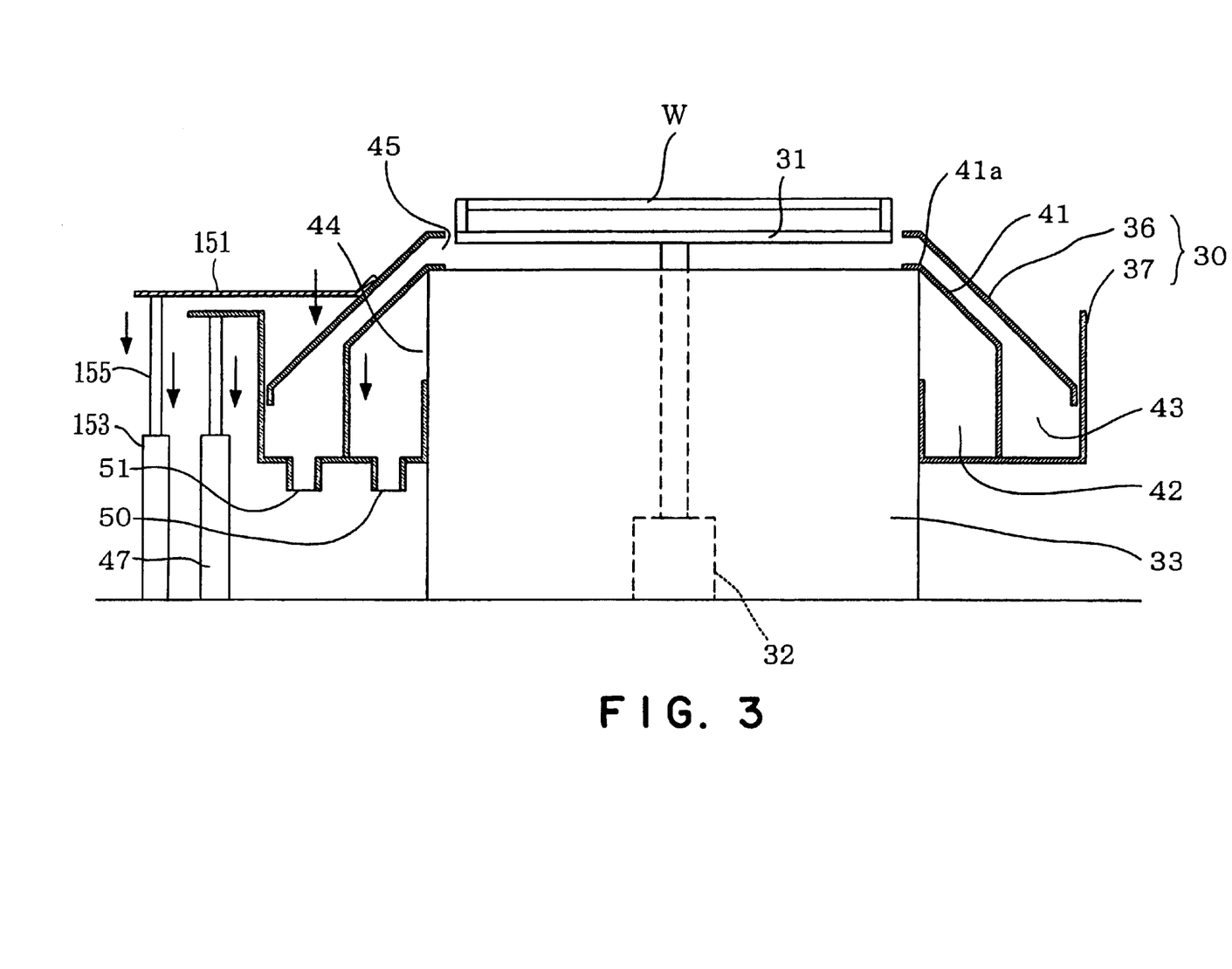
FIG. 3 is a sectional view of the wafer cleaning device of the first embodiment, showing its wafer loading or unloading condition.

In case of loading/unloading the wafer W with respect to the container 30, as shown in FIG. 3, the cylinder 153 is operated to lower the upper cup 36 and the cylinder 47 is also operated to lower the lower cup 37, realizing a "standby" condition that both upper and lower cups 36,37 are waiting below the spin chuck 31. Then, the upper cup 36 approaches the rectifying plate 41, so that the opening 45 is shortened in width or closed up. While, the upper end 41 of the rectifying plate 41 is brought into tight contact with the pedestal 33, so that the opening 44 is closed up to seal the interior atmosphere of the inner processing chamber 42. Consequently, the spin chuck 31 is exposed outside to allow the arms 23b, 23c of the transfer arm 4, which have entered into the device through the closing door, to deliver the wafer W before cleaning to the spin chuck 31 and also allow the arm 23a of the transfer arm 4 to receive the cleaned wafer W from the spin chuck 31.

Figure 4:
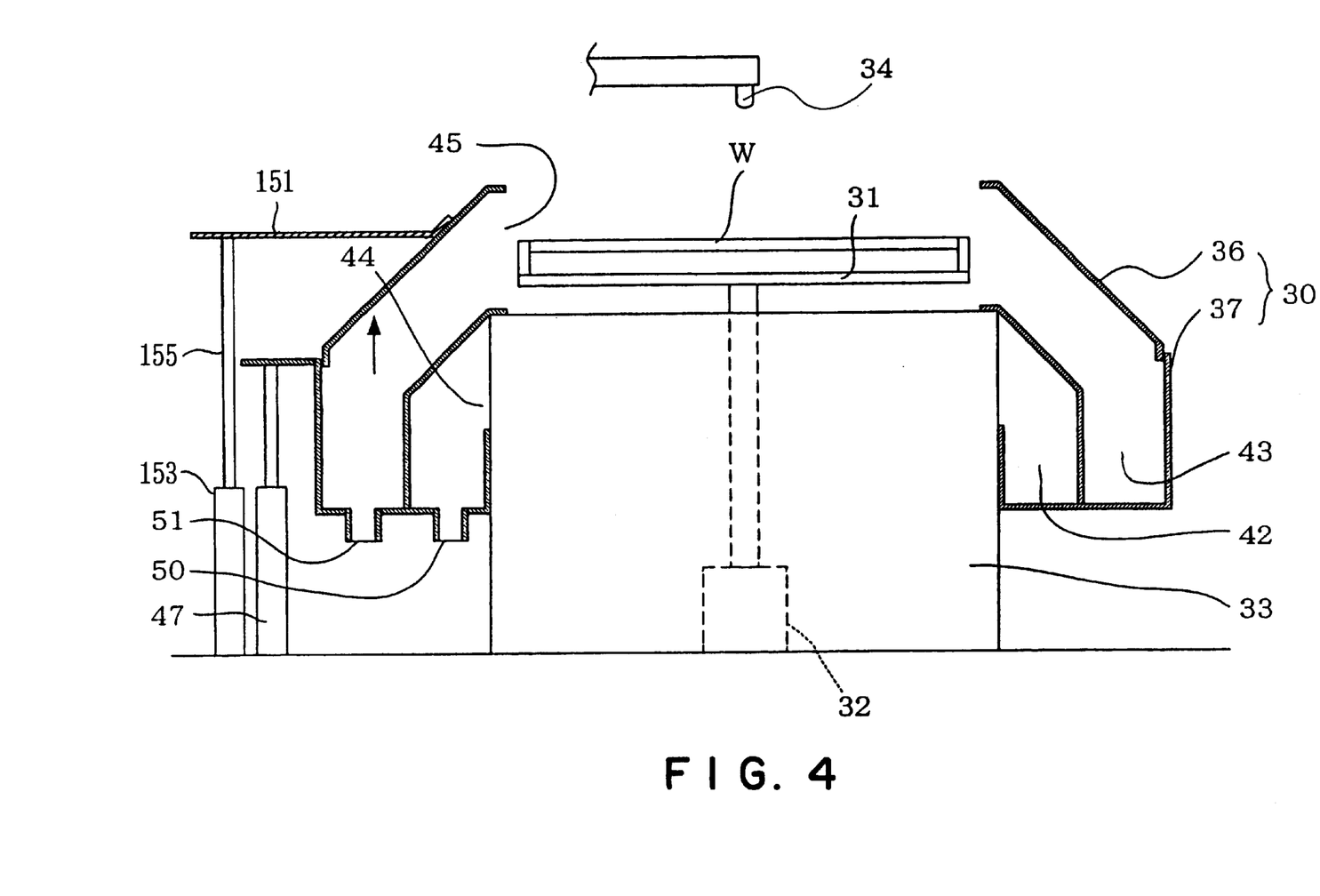
FIG. 4 is a sectional view of the wafer cleaning device of the first embodiment, showing its rinsing and spin drying conditions.

When only the upper cup 36 rises out of the condition of FIG. 3, the width of the opening 45 is enlarged into its opened condition, as shown in FIG. 4. Then, the circumference of the wafer W is surrounded by the opening 45 of the outer processing chamber 43. If the rinsing is carried out under such a condition, then the pure water dispersed from the wafer W enters into the outer processing chamber 43 through the opening 45 and subsequently flows into the second drainage line 51. From the condition of FIG. 4, when the operation of the cylinder 47 causes the lower cup 37 to rise and further the upper cap 36 is also elevated in parallel with the lower cup 37, the circumference of the wafer W is surrounded by the opening 44 of the inner processing chamber 42, as shown in FIG. 2. If performing the SC1 cleaning under such a condition, then APM dispersed from the wafer W enters into the inner processing chamber 42 through the opening 44 and subsequently flows into the first drainage line 50.

Figure 5:
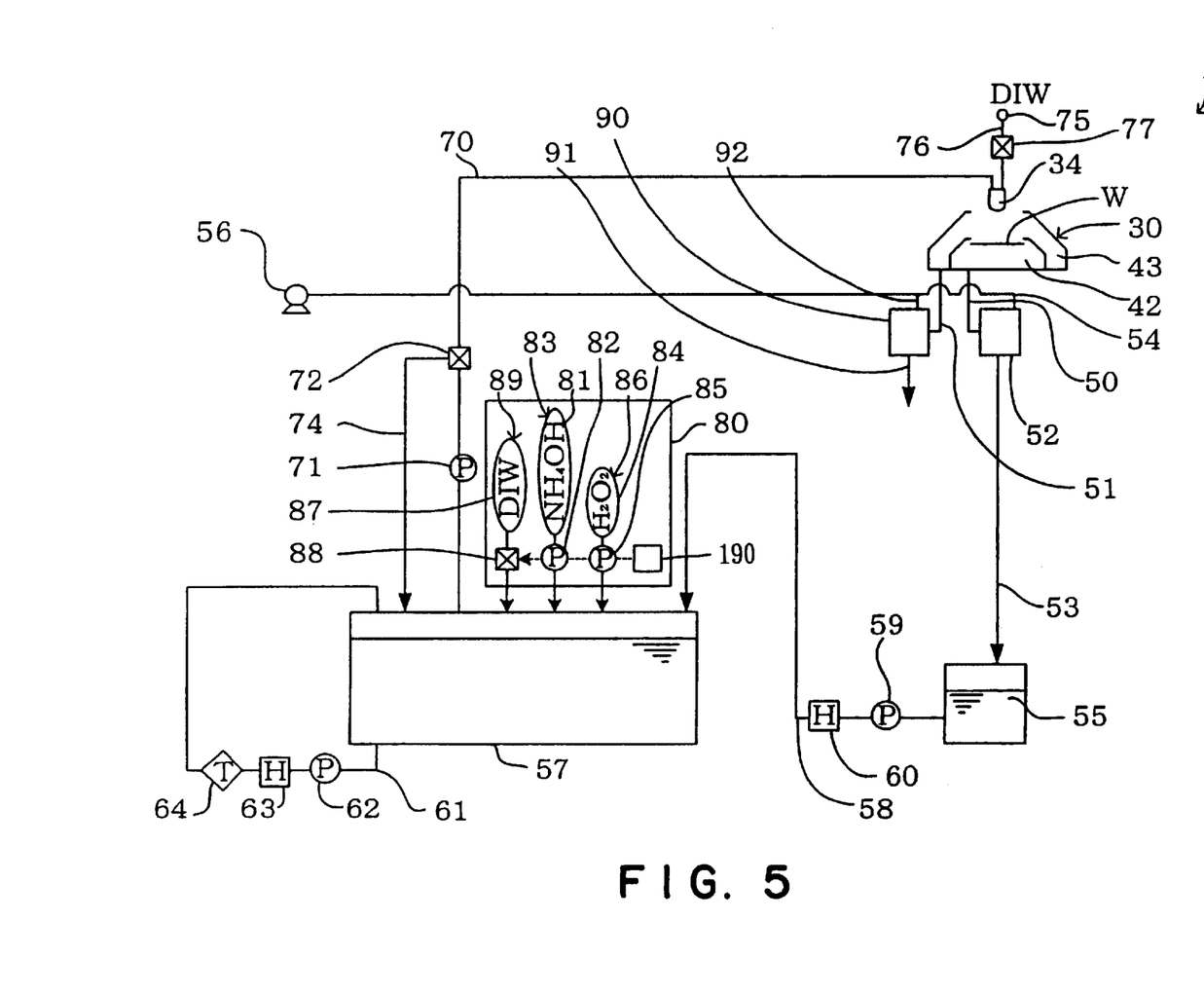
FIG. 5 is a line diagram of the wafer cleaning device of the first embodiment of the present invention.

As shown in FIG. 5, the first drainage line 50 is connected to a first gas-liquid separating mechanism 52. A collecting line 53 and a first exhausting line 54 are provided so as to diverge from the gas-liquid separating mechanism 52. The collecting line 53 is connected with a sub-storage tank 55, while the first exhausting line 54 is connected with an exhaust fan 56. Consequently, so-drained APM flows into the collecting line 53 and the sub-storage tank 55 via the gas-liquid separating mechanism 52, while the so-discharged interior atmosphere of the inner processing chamber 42 flows into the first exhausting line 54 via the gas-liquid separating mechanism 52 and finally, the atmosphere is discharged to the outside.

The sub-storage tank 55 is connected to a main storage tank 57 through a connecting line 58. The connecting line 58 is provided with a pump 59 and a heater 60 as a temperature-controller mechanism. The operation of the pump 59 allows APM to enter from the downside of the sub-storage tank 55 the 15 into the connecting line 58. The temperature of APM is adjusted to a predetermined temperature, for example, 85° C. by the heater 60 and thereafter, APM is supplied into the main storage tank 57.

Hereat, it is noted that when the flowing rate of APM into the heater 60 is controlled, the sub-storage tank 55 has a role to keep the temperature of APM supplied into the main storage tank 57, uniformity. That is, if having no sub-storage tank 55 and when a discharge of APM to be discharged through the collecting line 53 varies, it would be impossible to absorb this change. Therefore, since the heater 60 having a limited ability cannot cope with the change, if the flowing rate of APM increases excessively, then the temperature of liquid is lowered. In order to prevent the temperature of liquid from being lowered, it is necessary to make a heater 60 large-sized. However, it would cause the manufacturing cost to be increased. To the contrary, according to the embodiment, since there is provided the sub-storage tank 57 on the upstream side of the heater 60, it is possible to control the flow rate of APM and therefore, even the heater having a limited ability can adjust the temperature of APM sufficiently.

Preferably, the main storage tank 57 has a capacity to only store e.g. APM of 30 to 40 liters. Additionally, the main storage tank 57 is provided with a circulatory line 61 for circulating APM. The circulatory line 61 has its inlet connected with the bottom face of the main storage tank 57 and the outlet connected with the top face of the main storage tank 57. A pump 62, a heater 63 and a filter 64 are interposed in the circulatory line 61. In this case, it is preferable that the pump 62 has a discharge amount of e.g. 20 liter/min. The operation of the pump 62 allows APM to flow in the circulatory line 61 through the underside of the main storage tank 57. In the line 61, the heater 63 operates so as to realize APM of 85° C. and, after being cleaned by the filter 64, APM is returned to the main storage tank 57 again.

Also connected with the main storage tank 57 is an APM supply line 70 (as supply means) which supplies the supply nozzle 34 with APM. This APM supply line 70 is equipped with a pump 71 and a three-directional valve 72. The three-directional valve 72 has a return line 74 connected thereto, for returning APM in the APM supply line 70 to the main storage tank 57. By manipulating the three-directional valve 72, it is possible to perform the supply of APM to the supply nozzle 34 and the return of APM to the main storage tank 57 selectively and appropriately. In this way, owing to the manipulation of the three-directional valve 72 and also the operation of the pump 71, APM in the main storage tank 57 can be fed to the supply nozzle 34, accomplishing the recycling of APM.

In the rotary cleaning method, the temperature of APM is apt to fall within a period from the supply of APM onto the wafer W till the scattering in the inner processing chamber 42 by the centrifugal force. In recycling APM, it is necessary to carry out an appropriate temperature-control of APM so that the temperature of APM on supply is adjusted to a designated temperature. To keep the liquid in the main storage tank 57 at a predetermined temperature by operating the heater 63 in the circulatory line 61 allows the liquid supplied to the wafer W to be maintained at the above-designated temperature. Additionally, by operating the heater 60 in the connecting line 58 so as to keep the temperature of APM flowing into the main storage tank 57 at a predetermined temperature, it is possible to prevent the liquid temperature in the main storage tank 57 from being lowered. Thus, it is possible to supply the wafer W with APM adjusted at the designated temperature more certainly.

During the operation of the device, the pumps 62,71 are always operated. For example, the operation of the pump 62 causes APM to be circulated through the circulatory line 61, so that the main storage tank 57 can be always filled up with APM on temperature-control. While, the operation of the pump 71 causes APM in the main storage tank 57 to be circulated through the APM supply line 70 (part) between the tank 57 and the three-directional valve 72 and also the return line 74. Such an operation of the pump 71 is effective in the "stand-by" period from the unloading of the first wafer W out of the container 30 till the loading of the second wafer W. Owing to the circulation of APM upon temperature-control in this stand-by period, there is no possibility that the APM supply line 70 (part) between the tank 57 and the three-directional valve 72 and also the return line 74 are cooled down. Further, it is carried out in the stand-by period to provide the return line 74 with APM remained in the APM supply line 70 (part) between the three-directional valve 72 and the supply nozzle 34, thereby emptying the same APM supply line 70. If it is not emptied, then the residual APM is cooled down due to radiation of heat etc. If so, when processing the second wafer W, the so-remained and cooled APM and APM of the designated temperature are mixed together in the APM supply line 70 (part) between the three-directional valve 72 and the supply nozzle 34, so that APM of lowered temperature will be supplied to the wafer W. According to the embodiment, since APM is circulated in the APM supply line 70 (part) between the three-directional valve 72 and the supply nozzle 34 during the stand-by period in order to empty the same APM supply line 70 (part), it is possible to supply the wafer W with APM after the adjustment of the designated temperature. Besides, if the pipe between the three-directional valve 72 and the supply nozzle 34 is shorter in length, it will be preferable that much better in view of reducing an influence by the so-cooled pipe on APM as possible.

Also connected to the supply nozzle 34 is a pure-water supply line 76 which supplies the pure water from a pure-water source 75 to the wafer. The pure-water supply line 76 is equipped with a valve 77. Note, when performing the rinsing process, it is desirable to supply the wafer with the pure water of normal temperature.

The main storage tank 57 is provided with a supplementary mechanism 80 which supplements ammonia solution ($NH_4OH$), hydrogen peroxide water and the pure water as occasion demands, appropriately. The supplementary mechanism 80 comprises an ammonia supplementary system 83 provided with, for example, a tank 81 for storing the ammonia solution as a supplementary tank for supplementing the main storage tank with processing liquid adjusted to have a designated density and also a pump 82; a hydrogen-peroxide-water supplementary system 86 provided with a tank 84 for storing the hydrogen peroxide water adjusted to have a designated density and also a pump 85; a pure-water supply system 89 provided with a tank 87 for storing the pure water and a valve 88; and a controller 90 for controlling the availability factors of the pumps 82, 85 and also the opening degree of the valve 88. In this way, since the controller 90 controls the respective availability factors of the pumps 82, 85 and the opening degree of the valve 88 appropriately, it is possible to supplement the main storage tank 57 with ammonia solution ($NH_4OH$), hydrogen peroxide water and the pure water of designated quantities, thereby to produce APM with a designated components ratio.

On the other hand, the second drainage line 51 is connected to a second gas-liquid separating mechanism 90. A drainage line 91 and a second exhausting line 92 are provided so as to diverge from the second gas-liquid separating mechanism 90. Consequently, the so-drained pure water flows into the drainage line 91 via the second gas-liquid separating mechanism 90 and is discharged to the outside, while the so-discharged interior atmosphere of the outer processing chamber 43 flows into the second exhausting line 92 via the second gas-liquid separating mechanism 90 and finally, the atmosphere is discharged to the outside.

The exhausting fan 56 can carry out the exhausting operation in both cases of the inner processing chamber 42 and the outer processing chamber 43. Again, the exhausting fan 56 in operation has a fixed output. Since the opening 44 is opened in the SC1 cleaning condition of FIG. 2, the exhausting fan 56 serves to mainly exhaust the chemical (APM) atmosphere of the SC1 cleaning through the inner processing chamber 42 without diffusing the above atmosphere to the outside. Further, as the opening 45 is also opened, the chemical atmosphere may be exhausted through the outer processing chamber 43. Thus, since the exhausting zone is maximized by the adoption of the inner processing chamber 42 and the outer processing chamber 43, the displacement of the container 30 can be increased. On the other hand, in the rinsing and spin-drying condition of FIG. 4, it is carried out to seal up the interior atmosphere of the inner processing chamber 42, so that the interior atmosphere is exhausted through the outer processing chamber 43 as the exhausting zone. Even if the closing of the inner processing chamber 42 causes the chemical atmosphere to be remained in the inner processing chamber 42, the device has a structure capable of preventing the chemical atmosphere from being diffused when rinsing and loading/unloading the wafer. Furthermore, under the wafer loading/unloading condition of FIG. 3, the exhaust zone is minimized or abolished quite. In this way, the exhausting zone of the exhausting fan 56 can be established between the inner processing chamber 42 and the outer processing chamber 43 freely.

Further, in this way, the SC1 cleaning and the rinsing are performed in different chambers and there are individually provided the first drainage line 50 for draining APM and a second drainage line 51 for draining the pure water used in the rinsing process. Therefore, the device is constructed so that the pure water used in the rinsing process does not enter into the APM line. Accordingly, there is no possibility of mixing of APM with the pure water and also no possibility that the line system of APM is cooled by the pure water used in the rinsing process.

In the others, the wafer cleaning devices 6, 8, 9, 11, 12 have the similar structures commonly and therefore, their detailed descriptions are eliminated. Note that, due to the using of the same chemical liquid (APM), the wafer cleaning devices 5, 6 may include the common line system of the same chemical liquid partially (e.g. the main storage tank 57, the sub-storage tank 55, the connecting line 58, the circulatory line 61, etc.) in view of space reduction. Similarly, the wafer cleaning devices 8, 9 and the wafer cleaning devices 11, 12 may have the common line system of the respective chemical liquids (HPM, DHF) in part.

Next, we explain the operation and effect of the so-constructed wafer cleaning devices 5, 6, 8, 9, 11 and 12 on the ground of the cleaning process of the wafer W in the cleaning apparatus 1 of FIG. 1. First, a not-shown transfer robot mounts the carrier C in which, for example, twenty-five sheets of wafers W are accommodated, on the mounting section 2. Next, the wafers W are taken out of the carrier C mounted on the mounting section 2, one by one by the transfer arm 4. The transfer arm 4 transfers the wafers W to the wafer cleaning devices 5, 8, 11 and the wafer cleaning devices 6, 9, 12 in turn. In this way, the designated cleaning process is carried out to remove impurities, such as organic contamination and particles, adhering to the surfaces of the wafers W.

We now describe the process performed by the wafer cleaning device 5, representatively. Firstly, ammonia solution ($NH_4OH$), hydrogen peroxide liquid ($H_2O_2$) and the pure water (DIW) of designated quantities are beforehand supplemented from the supplement mechanism 80 into the main storage tank 57 thereby to produce APM. During the stand-by period, the pump 62 operates to allow APM in the main storage tank 57 to circulate in the circulatory line 61 and also APM to be regulated in temperature by the heater 63 and cleaned by the filter 64. While, the pump 71 circulates APM through the APM supply line 70 (part) between the main storage tank 57 and the three directional valve 72 and also the return line 74. It is noted to adjust APM to a designated temperature, e.g. 85° C., in order to exhibit its high cleaning ability. On the other hand, as shown in FIG. 3, the upper cup 36 and the lower cup 37 are lowered into the stand-by position below the spin chuck 31, so that the spin chuck 31 is exposed to carry the wafer W.

As shown in FIG. 2, after the supply nozzle 34 has moved to the upside of the wafer W, the upper cup 36 and the lower cup 37 are elevated to move the opening 44 of the inner processing chamber 42 to the circumference of the wafer W. The motor 32 operates to rotate the spin chuck 31, while the supply nozzle 34 ejects APM supplied from the main storage tank 57 for several seconds (e.g. 90 sec) to several minutes. For example, in the SC1 cleaning, the supply nozzle 34 reciprocates above the wafer W from its center to the periphery while ejecting APM so as to clean the surface of the wafer W uniformly.

The inner atmosphere of the inner processing chamber 42 is discharged to the outside through the first exhausting line 50. Then, since the openings 44, 45 are opened to widen the opening area of the cup for the exhausting operation through the inner and outer processing chambers 44, 45, the exhaust displacement can be increased to prevent the chemical atmosphere (APM) from being diffused to the exterior. Further, APM scattering into the inner processing chamber 42 is drained through the first drainage line 50. After passing through the first gas-liquid separating mechanism 52, the collecting line 53, the sub-storage tank 55 and the connecting line 58 in order, APM is finally collected to the main storage tank 57. In process of this collecting operation by the connecting line 58, the first temperature control and cleaning is carried out. Next, APM in the main storage tank 57 is circulated into the circulatory line 61 to perform the second temperature-control and cleaning to adjust and clean APM to 85° C. in temperature. The so-controlled and cleaned APM is again supplied to the supply nozzle 34 via the APM supply line 70. In this way, APM in the main storage tank 57 is repeatedly used to save the consumption of APM.

Next, the upper cup 36 and the lower cup 37 are lowered to allow the opening 45 of the outer processing chamber 43 to move to the circumference of the wafer W carried by the spin chuck 31, as shown in FIG. 4. While rotating the wafer W, the pure water of the normal temperature is supplied to the wafer W through the supply nozzle 34, performing the rinsing to wash APM away from the wafer W The interior atmosphere of the outer processing chamber 43 is exhausted to the outside through the second exhausting line 51. Further, after draining the pure water scattered in the outer processing chamber 43 through the second exhausting line 51, the operational power of the motor 32 is progressed to rotate the spin chuck 31 at a higher speed than that of the SC1 cleaning and rinsing, thereby performing the spin drying to remove water droplets from the wafer W. In the rinsing and spin drying, since the inner processing chamber 42 is sealed up as shown in FIG. 4, there is little possibility that the chemical (APM) atmosphere is diffused to the outside. Owing to the adoption of only the outer processing chamber 43 as the exhausting zone, it is possible to reduce the exhaust displacement in the container 30 in comparison with the SC1 cleaning.

Thereafter, the upper cup 36 falls to expose the spin chuck 31 and the wafer W in order to unload the wafer W after cleaning, as shown in FIG. 3. At this time, since the inner processing chamber 42 is closed and the opening 45 is reduced or eliminated to minimize or abolish the exhausting zone, it is possible to reduce the exhaust displacement in the container 30. Further, since the upper cup 36 is lowered thereby to reduce the height of the container 30 in both loading and unloading the wafer, it is possible to save a space for allowing the container 30 to wait below the spin chuck 30, correspondingly. Thus, it is possible to perform the loading and unloading of the wafer appropriately.

In case of using APM as the cleaning liquid in the wafer cleaning device 5, the SC1 of APM is executed upon moving the opening 44 of the inner processing chamber 42 to the circumference of the wafer W carried by the spin chuck 31 and subsequently, the draining of APM is carried out through the first drainage line 50. In case of using the pure water as the cleaning liquid in the wafer cleaning device 5, the rinsing is executed upon moving the opening 45 of the outer processing chamber 43 to the circumference of the wafer W carried by the spin chuck 31 and subsequently, the draining of the pure water is carried out through the second drainage line 51. In APM and the pure water on drainage, particularly, APM is again supplied from the supply nozzle 34 to the wafer W in the recycling of APM. It is noted that even if there are respectively remained APM in the first drainage line 50 and the pure water in the second drainage line 51, there is no possibility that the cleaning liquids of different kinds are present in the same line, by altering the processing chamber corresponding to the cleaning liquid on use. In particular, since APM for recycling is not diluted by the pure water, a high cleaning ability of APM can be successively maintained to reuse it in the SC1 cleaning. By adjusting the controller 90 in the supplementary mechanism 80 appropriately, it is also possible to omit troubles to supplement ammonia solution and hydrogen peroxide liquid in APM, as one countermeasure of diluted APM.

Both APM and pure water have different optimum temperatures to enhance the cleaning abilities, respectively. Nevertheless, as the drainage lines for the respective cleaning liquids are fixed respectively, it is possible to prevent the first drainage line 50 from being cooled by the pure water in the rinsing process. Therefore, APM is not subjected to a change in temperature, for example, its temperature fall due to the so-cooled first drainage line 50. Additionally, even if APM, which has been used for the SC1 cleaning, is cooled in the inner processing chamber 42 to a temperature lower than the designated temperature, the temperature APM is controlled in the connecting line 56 in advance of the main storage tank 56 and subsequently controlled in the circulatory line 60 again. In this way, owing to the provision of twice opportunities to control the temperature of APM by the connecting line 58 and the circulatory line 61, it is possible to adjust APM to the designated temperature stably and certainly. Accordingly, with no change in temperature, it is possible to supply the surface of the wafer W with APM which is always maintained to the designated temperature, accomplishing the appropriate SC1 cleaning.

Further, corresponding to the kinds of cleaning liquids, the processing chamber surrounding the periphery of the wafer W can be switched between the inner processing chamber 42 and the outer processing chamber 43 and the exhausting zone can be also established between these chambers 42, 43 freely. Therefore, the exhaust displacement in the container 30 can be altered at the times of the SC1 cleaning, the rinsing, the loading and unloading of the wafer W. Thus, there is no need of providing the container with a large exhaust displacement, no excessive burden is applied on the exhausting fan 56 and additionally, it is possible to reduce the whole displacement of the container 30 in comparison with that of the conventional container.

In this way, according to the wafer cleaning device 5 of the first embodiment, the reuse of APM can be performed advantageously and the exhaust displacement can be reduced. Therefore, while restricting the APM consumption, it is possible to eliminate processing defectiveness and processing irregularity derived from the dilution of the processing liquid and the change in temperature of the processing liquid, completing the appropriate SC1 cleaning. Additionally, the substrate processing device of the present invention is superior with respect to its running cost.

Note that the output of the exhausting fan 56 may be appropriately changed in response to the progress situation of the processing although the output has been fixed during the processing in the above embodiments. For example, at the SC1 cleaning of FIG. 2, the output of the exhausting fan 56 is increased so that the chemical atmosphere at the SC1 cleaning does not spread to the outside. On the other hand, as mentioned before, the interior atmosphere of the inner processing chamber 42 is tightly closed up at both rinsing and spin drying of FIG. 4. Thus, since there is no possibility that the chemical atmosphere is diffused to the outside, it is not required to ensure an excessive exhausting of the inner processing chamber 42 in comparison with that at the SC1 cleaning. As a result, the exhausting fan 56 has only to have a minimum output so that the interior atmosphere is not diffused, in accordance with the present situations of the outer processing chamber 43 and the inner processing chamber 42. Further, in the condition of loading/unloading wafer of FIG. 3, the output of the exhausting fan 56 can be minimized furthermore.

In this way, by altering the output of the exhausting fan 56 at the SC1 cleaning, rinsing and wafer-loading/unloading, it is possible to reduce the burden on the exhausting fan 56 and the whole displacement of the container 30.

Figure 6:
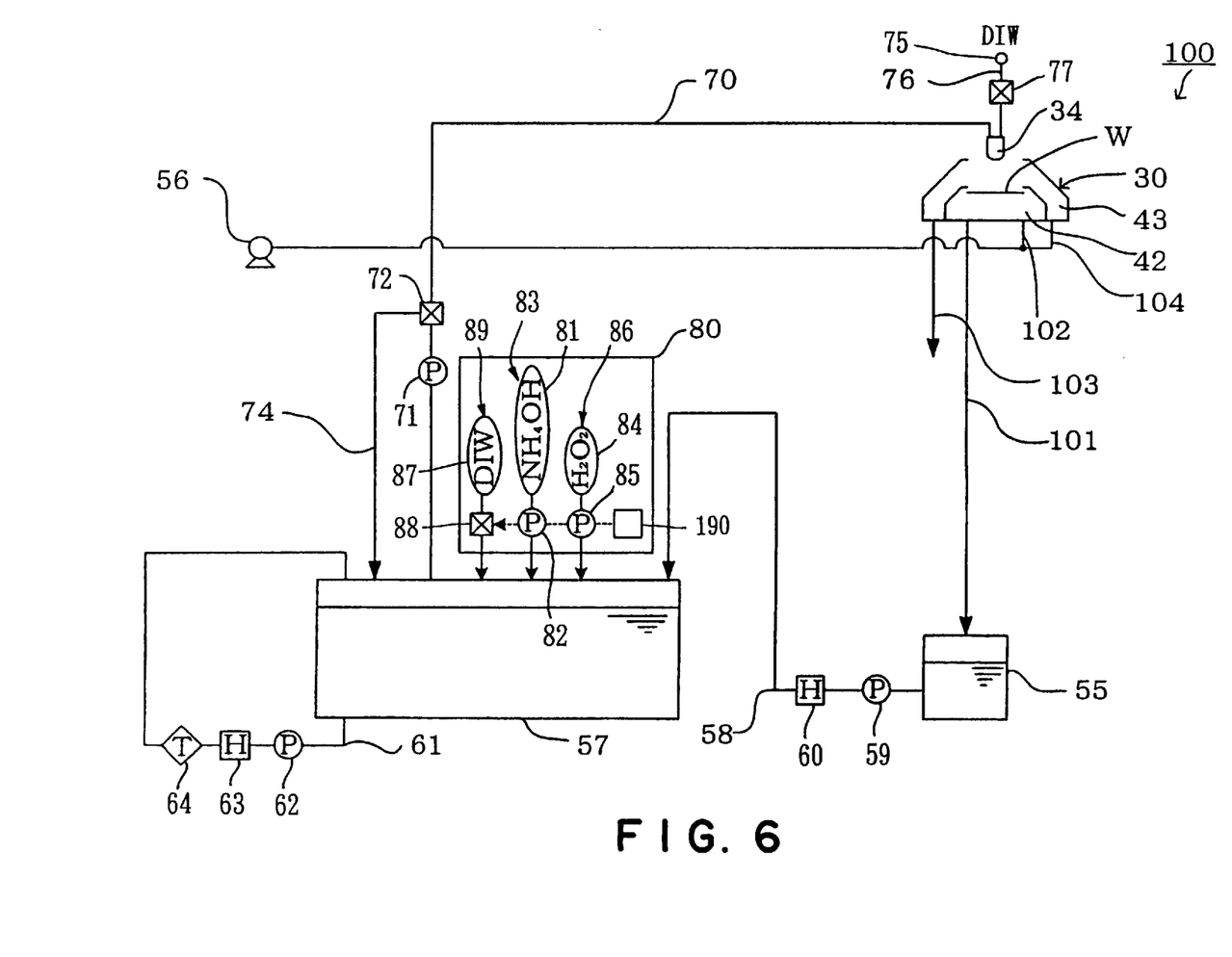
FIG. 6 is a line diagram of the wafer cleaning device in accordance with the second embodiment of the present invention.

Next, a wafer cleaning device 100 in accordance with the second embodiment of the invention will be described with reference to FIG. 6. This wafer cleaning device 100 is provided with a line to drain the cleaning liquid and another line to exhaust the interior atmosphere, in place of the first and second gas-liquid mechanisms 52, 90. The structure of the wafer cleaning device 100 is similar to that of the previously-mentioned wafer cleaning device 5 except the individual provision of the line for draining the cleaning liquid and the line for exhausting the interior atmosphere. Therefore, elements similar to those of the wafer cleaning device 5 in terms of both function and constitution are indicated with the same reference numerals respectively and their overlapping descriptions will be eliminated in the following descriptions.

In detail, a first drainage line 101 for draining APM and a first exhausting line 102 for discharging the interior atmosphere are together connected to the bottom face of the inner processing chamber 42. The first drainage line 101 is connected to the sub-storage tank 55 directly, while the first exhausting line 102 is connected with the exhausting fan 56. Similarly, a second drainage line 103 for draining the pure water and a second exhausting line 104 for discharging the interior atmosphere are together connected to the bottom face of the outer processing chamber 43. The second exhausting line 104 is joined to the first exhausting line 103.

According to the wafer cleaning device 100, the drainage of APM and the exhausting of the interior atmosphere in the inner processing chamber 42 can be carried out through different lines and similarly, the drainage of the pure water and the exhausting of the interior atmosphere in the outer processing chamber 43 can be carried out through different lines. Particularly in APM, since it does not coexist with the interior atmosphere of the inner processing chamber 42 in the same line, a variety of influences due to the exhaust gas would not affect on APM. For instance, it is possible to prevent APM from being cooled by an air stream produced in exhausting, accomplishing APM to be stably and certainly adjusted to a designated temperature in comparison with the case of the wafer cleaning device 5.

Figure 7:
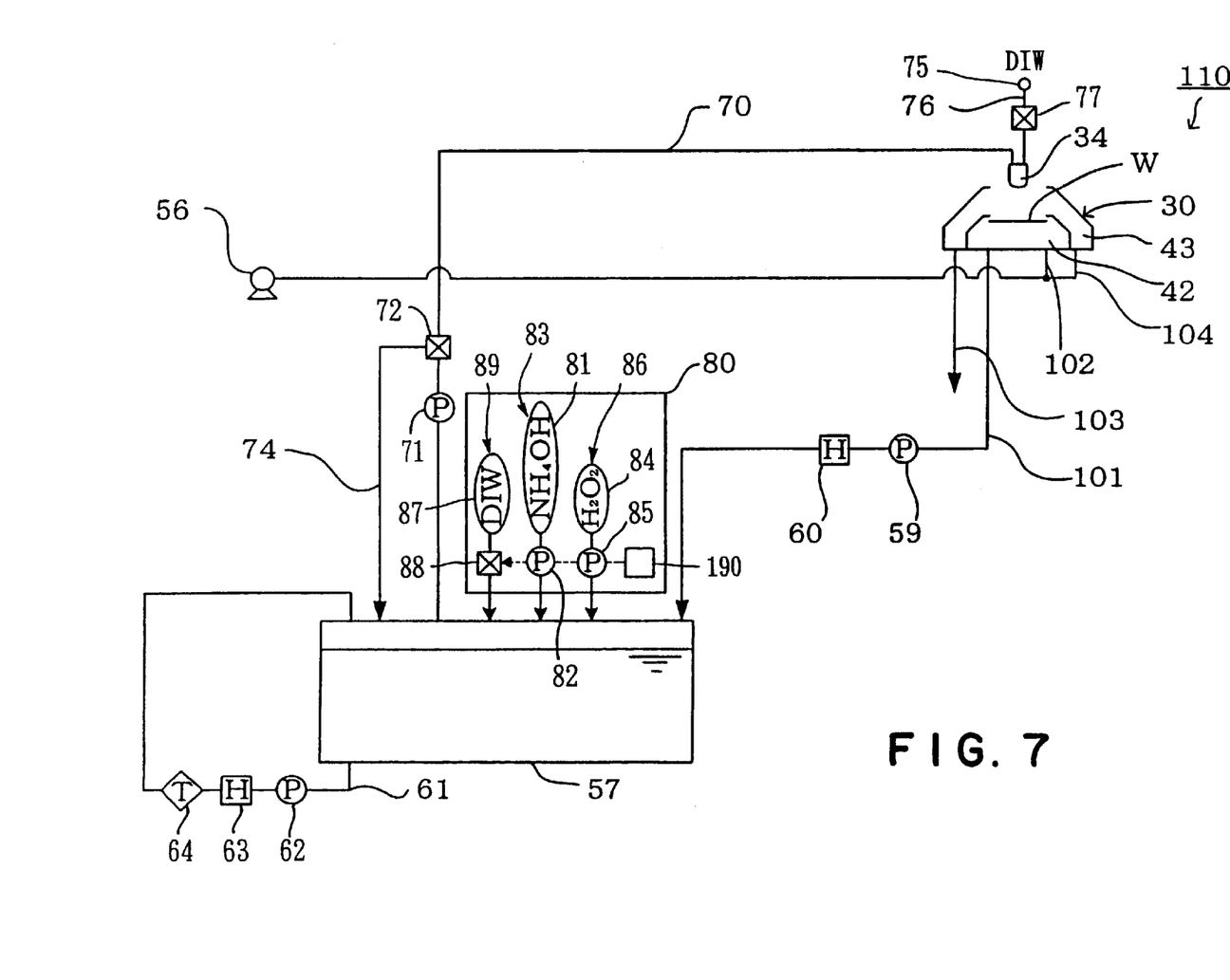
FIG. 7 is a line diagram of the wafer cleaning device in accordance with the third embodiment of the present invention.

Next, a wafer cleaning device 110 in accordance with the third embodiment will be described with reference to FIG. 7. This wafer cleaning device 110 is provided with a line to drain the cleaning liquid and a line to exhaust the interior atmosphere, independently. Further, the above-mentioned sub-storage tank 55 is eliminated. In detail, as shown in FIG. 7, the main storage tank 57 is directly connected to the first drainage line 101. The first drainage line 101 is provided with the pump 59 and the heater 60. With the structure mentioned above, it is possible to miniaturize the device as the sub-storage tank 55 is deleted.

Figure 8:
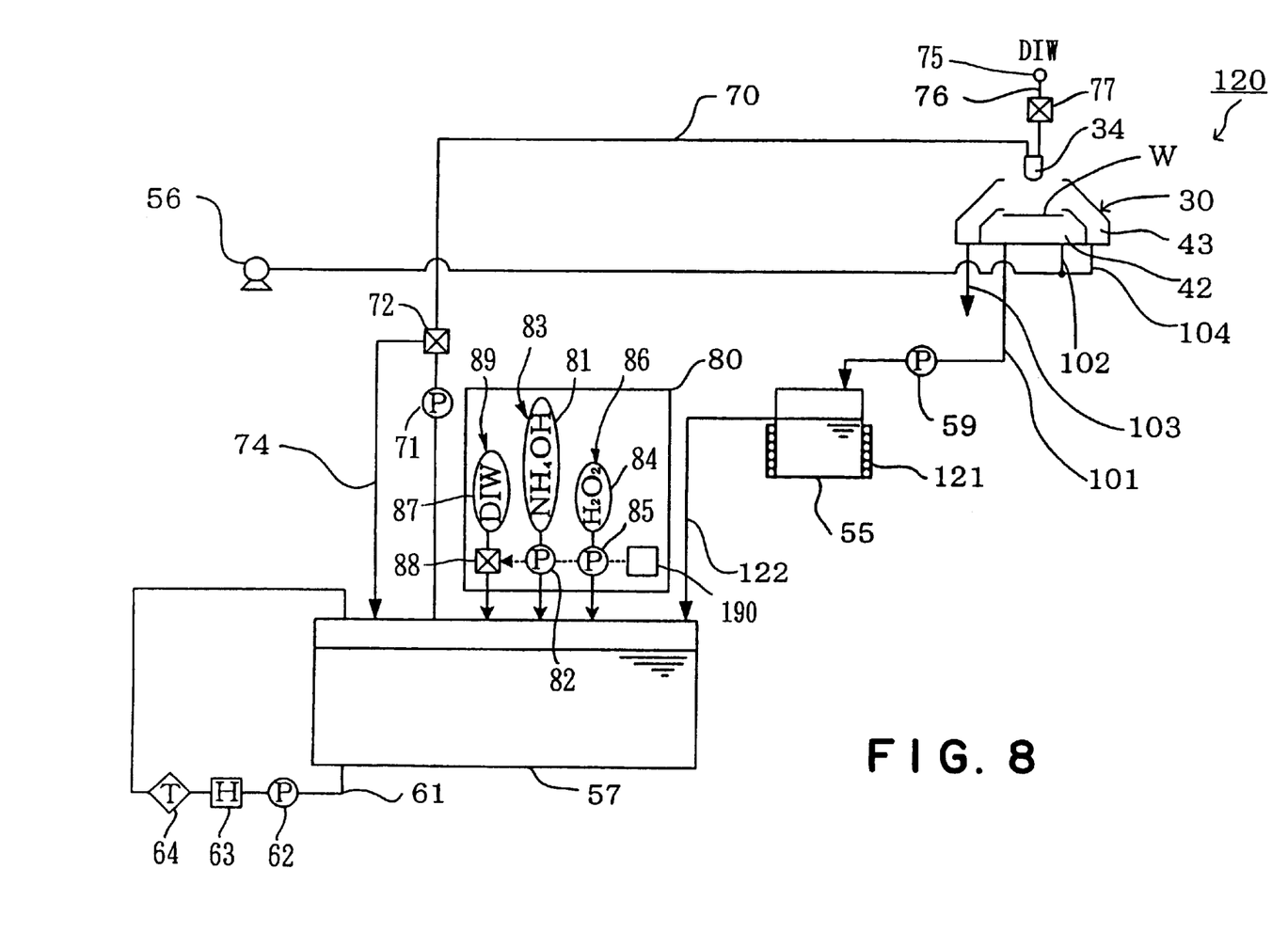
FIG. 8 is a line diagram of the wafer cleaning device in accordance with the fourth embodiment of the present invention.

Next, a wafer cleaning device 120 in accordance with the fourth embodiment will be described with reference to FIG. 8. This wafer cleaning device 120 is provided with a line for draining the cleaning liquid and a line for exhausting the interior atmosphere, independently. Further, a cartridge heater 121 is attached to the sub-storage tank 55.

The first drainage line 101 is connected with the sub-storage tank 55 and also provided with the pump 59. The sub-storage 55 is disposed above the main storage tank 57. The main storage tank 57 is communicated with the sub-storage tank 55 through an overflow line 122. While making use of a difference in level between the main storage tank 57 and the sub-storage tank 55 and also utilizing self-respect falling, the wafer cleaning device 120 is adapted so as to drop APM overflowing the sub-storage tank 55, into the main storage tank 57 through the overflow line 122.

In the wafer cleaning device 120, the heating of the cartridge heater 121 allows APM in the sub-storage tank 55 to be controlled in terms of temperature. Since the temperature of APM is adjusted while being stored in the sub-storage tank 55, it is possible to complete the temperature-control of APM with room in comparison with the case of controlling the temperature of APM by its passing through the heater. Further, as APM of fixed quantity, which has been subjected to the temperature control to some degree, flows into the main storage tank 57 via the overflow line 122, it is possible to adjust APM to a designated temperature more stably and certainly.

Figure 9:
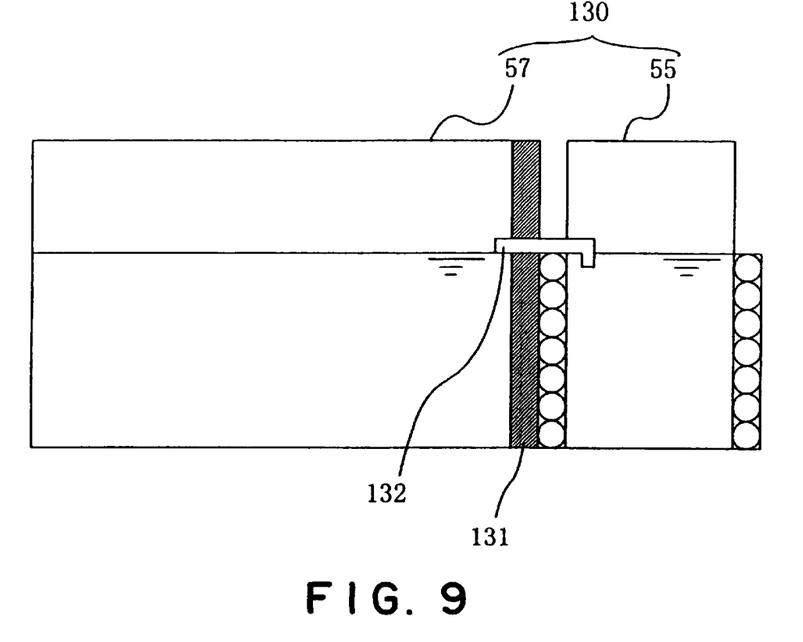
FIG. 9 is an explanatory diagram of a combined tank in which a main storage tank and a sub-storage tank are combined.

Note that, as shown in FIG. 9, there may be provided a merger tank 130 which combines the sub-storage tank 55 with the main storage tank 57. In the merger tank 130, the sub-storage tank 55 is adjacent to the main storage tank 57 through a wall 131 and an overflow pipe 132 allows APM in the sub-storage tank 55 to flow into the main storage tank 57. With this structure, the miniaturization of the device can be progressed.

Although the present invention has been described with reference to the wafer cleaning device for cleaning the wafers one by one, namely, one-piece type wafer cleaning device, the present invention is also applicable to a so-called "batch" type wafer cleaning device which cleans a plurality of wafers by dipping them in a cleaning bath filled up with the cleaning liquid. Moreover, the present invention is also applicable to a device for performing another process besides the cleaning process, for example, a device for applying a predetermined processing liquid on the wafer. Again, the present invention has been described by examples using the wafers W as the substrates, the invention is not limited to such examples only and applicable to process e.g. LCD substrates, glass substrates, CD substrates, photo-masks, printed substrates, ceramic substrates, etc.

Although the processing liquid is set to a high temperature by the heater in the above-mentioned embodiments, the present invention is also applicable to a case of setting the processing liquid at a low temperature by a cooling unit or the like, conversely.

As mentioned above, according to the invention, it is possible to accomplish to reuse the processing liquid suitably, whereby the exhaust displacement can be reduced. Therefore, while restricting the consumption of the processing liquid, it is possible to eliminate processing defectiveness and processing irregularity derived from the dilution of the processing liquid and the change in temperature of the processing liquid, completing the appropriate processing. Additionally, the substrate processing device of the present invention is superior with respect to its running cost. According to the invention, it is possible to provide twice opportunities for controlling the temperature of the processing liquid, whereby the processing liquid can be adjusted to a designated temperature stably and certainly. Particularly, with the feature claimed in claim 7, it is possible to control the temperature of the processing liquid with room. Again in claim 8, the loading and unloading of the substrate can be carried out advantageously. Further, it is possible to exhaust the interior atmosphere and also possible to exclude various influences caused in exhausting the interior atmosphere, from the drained processing liquid.

What is claimed is:

1. A substrate processing device for processing a substrate, comprising:

a holder for carrying the substrate;

a nozzle for supplying plural kinds of processing liquids to a surface of the substrate;

a container arranged around the holder, the container having a plurality of processing chambers, the plurality of processing chambers having a plurality of openings respectively which are arranged in succession, wherein the plurality of processing chamber includes at least a first processing chamber and a second processing chamber, the container including a first member defining the first processing chamber and a part of the second processing chamber and a second member defining the second processing chamber in cooperation with the first member, the first member and the second member are movable up and down relatively each other, the first processing chamber being provided with a first opening, the second processing chamber being provided with a second opening, the container is movable with respect to the holder relatively so that the first opening and the second opening can be moved to and positioned around the circumference of the substrate held by the holder; and wherein a bottom of each processing chamber being connected with a discharging line for discharging processing liquid from the processing chamber, and at least one of the discharging lines being connected to the nozzle so that the discharged processing liquid is supplied to a surface of the substrate through recycling circuit.

2. A substrate processing device for processing a substrate, according to claim 1, wherein respective atmospheres in the first and second containers are also discharged through the discharging lines connected to the bottom surfaces of the first and second containers.

3. A substrate processing device for processing a substrate, according to claim 2, further comprising respective gas-liquid separating units that are arranged in the discharging lines, respectively.

4. A substrate processing device for processing a substrate, according to claim 3, wherein the first member and the second member descend, the second opening being positioned beside the substrate held by the holder while the first opening is closed, the atmosphere in the second processing chamber being discharged through the discharging line connected to the bottom surfaces of the second processing chamber.

5. A substrate processing device for processing a substrate, according to claim 4, wherein the discharging line connected to the first member.

6. A substrate processing device for processing a substrate, according to claim 3, wherein when chemical liquid is selected among a plurality of liquids for processing, the first opening is positioned beside the substrate held by the holder, the second opening being positioned above the first opening, the atmosphere of the chemical liquid is discharged through the first and second processing chambers and through the both discharging lines respectively connected to the surfaces of the first and second processing chamber.

7. A substrate processing device for processing a substrate, according to claim 6, wherein the discharging line connected to the first member.

8. A substrate processing device for processing a substrate, according to claim 1, wherein the recycling circuit is connected to the first member.

9. A substrate processing device for processing a substrate, according to claim 1, wherein the first member and the second member descend, the first opening being closed, the second opening being positioned under a level of the holder, then the substrate being transferred to and from the holder.

10. A substrate processing device for processing a substrate, according to claim 1, wherein the discharging line is only used for discharging liquid, and further comprising exhaust lines respectively connected to the bottom surfaces of the first processing chamber and the second processing chamber in order to discharge respective atmospheres in the first and second processing chamber.

11. A substrate processing device for processing a substrate, according to claim 10, further comprising a main storage tank interposed in the recycling circuit to store the processing liquid.

12. A substrate processing device for processing a substrate, according to claim 11, further comprising a circulatory line for circulating the processing liquid in the main storage tank, wherein the circulatory line is provided with a temperature controller which adjusts temperature of the processing liquid.

13. A substrate processing device for processing a substrate, according to claim 11, wherein the recycling circuit is provided with a temperature controller which adjusts temperature of the processing liquid.

14. A substrate processing device for processing a substrate, according to claim 13, further comprising a sub-storage tank arranged on an upstream side of the recycle line, wherein the temperature controller is disposed in a connecting line which connects the sub-storage tank with the main storage tank.

15. A substrate processing device for processing a substrate, according to claim 13, further comprising a sub-storage tank arranged on an upstream side of the recycle line, wherein the temperature controller is provided in the sub-storage tank.

16. A substrate processing device for processing a substrate; according to claim 11, further comprising a three-directional valve arranged between the main storage tank and the nozzle and a return line for returning the processing liquid from the three-directional valve to the main storage tank.

17. A substrate processing device for processing a substrate, according to claim 11, wherein the main storage tank is connected to supplementary tank for supplementing the processing liquid into the main tank.

* * * * *